United States Patent
Kawasaki

(10) Patent No.: US 10,243,535 B2
(45) Date of Patent: Mar. 26, 2019

(54) ELECTRONIC COMPONENT

(71) Applicant: Murata Manufacturing Co., Ltd., Nagaokakyo-shi, Kyoto-fu (JP)

(72) Inventor: Koichiro Kawasaki, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 243 days.

(21) Appl. No.: 15/348,325

(22) Filed: Nov. 10, 2016

(65) Prior Publication Data

US 2017/0179920 A1    Jun. 22, 2017

(30) Foreign Application Priority Data

Dec. 22, 2015    (JP) ................. 2015-250476

(51) Int. Cl.
*H03H 9/02* (2006.01)
*H03H 9/05* (2006.01)
(Continued)

(52) U.S. Cl.
CPC ..... *H03H 9/02952* (2013.01); *H01L 41/0533* (2013.01); *H03H 9/0547* (2013.01);
(Continued)

(58) Field of Classification Search
CPC ............ H03H 9/02952; H03H 9/0547; H03H 9/0566; H03H 9/0576; H03H 9/1071;
(Continued)

(56) References Cited

U.S. PATENT DOCUMENTS 6,928,719 B2 * 8/2005 Kim .................... H03H 9/02913
                                                     174/391
7,361,842 B2 * 4/2008 Brist ...................... H01P 3/084
                                                     174/252
(Continued)

FOREIGN PATENT DOCUMENTS

DE    10 2015 102 869 A1 *  9/2016
GB       2 095 477 A    *  9/1982
(Continued)

OTHER PUBLICATIONS

English language machine translation of JP 06-006170 A, published Jan. 14, 1994, 4 pages.*

(Continued)

*Primary Examiner* — Barbara Summons
(74) *Attorney, Agent, or Firm* — Keating & Bennett, LLP

(57) ABSTRACT

An electronic component includes first and second element substrates, first and second functional element portions, and a support layer that defines a first hollow space over a first functional electrode with the first and second element substrates. A second functional electrode is located on a first main surface of the second element substrate. The electronic component further includes a first conductive layer that is provided on a second main surface of the second element substrate and that is connected to ground potential. The first conductive layer opposes the first functional electrode in the first hollow space. The first conductive layer is overlapped with at least a portion of the first and second functional electrodes in a plan view.

17 Claims, 9 Drawing Sheets

(51) Int. Cl.
*H03H 9/10* (2006.01)
*H03H 9/64* (2006.01)
*H03H 9/72* (2006.01)
*H01L 41/053* (2006.01)

(52) U.S. Cl.
CPC ........ *H03H 9/0576* (2013.01); *H03H 9/1092* (2013.01); *H03H 9/64* (2013.01); *H03H 9/725* (2013.01); *H03H 9/1071* (2013.01)

(58) Field of Classification Search
CPC ........ H03H 9/1092; H03H 9/64; H03H 9/725; H03H 2009/0019; H01L 41/053; H01L 41/0533; H01L 41/081; H01L 41/083; H01P 3/08; H01P 3/088
USPC .................... 333/133, 187, 193, 195, 189
See application file for complete search history.

(56) References Cited

U.S. PATENT DOCUMENTS

| 2009/0224851 | A1 | 9/2009 | Feiertag et al. |
| 2010/0045145 | A1* | 2/2010 | Tsuda ...................... H03H 3/08 310/365 |
| 2010/0295151 | A1 | 11/2010 | Kurokawa |
| 2012/0280768 | A1 | 11/2012 | Nakayama et al. |
| 2015/0380634 | A1 | 12/2015 | Henn et al. |
| 2016/0173059 | A1 | 6/2016 | Schmidhammer |
| 2016/0301386 | A1 | 10/2016 | Iwamoto |
| 2017/0012603 | A1* | 1/2017 | Reisner ................ H03H 9/0566 |
| 2018/0013055 | A1* | 1/2018 | Metzger .................... B81B 7/02 |

FOREIGN PATENT DOCUMENTS

| JP | 60-020614 A | * | 2/1985 | .......... H03H 9/0547 |
| JP | 01-297881 A | | 11/1989 | |
| JP | 02-179018 A | * | 7/1990 | |
| JP | 06-006170 A | * | 1/1994 | |
| JP | 2008-546207 A | | 12/2008 | |
| JP | 2010-109269 A | | 5/2010 | |
| JP | 5300471 B2 | | 9/2013 | |
| JP | 2013-236401 A | | 11/2013 | |
| WO | 2014/135309 A1 | | 9/2014 | |
| WO | 2014/135442 A1 | | 9/2014 | |
| WO | 2015/098792 A1 | | 7/2015 | |

OTHER PUBLICATIONS

Official Communication issued in corresponding Japanese Patent Application No. 2015-250476, dated May 22, 2018.

* cited by examiner

ELECTRONIC COMPONENT

CROSS REFERENCE TO RELATED APPLICATIONS

This application claims the benefit of priority to Japanese Patent Application No. 2015-250476 filed on Dec. 22, 2015. The entire contents of this application is hereby incorporated herein by reference.

BACKGROUND OF THE INVENTION

1. Field of the Invention

The present invention relates to an electronic component including multiple functional element portions.

2. Description of the Related Art

Electronic components including multiple functional element portions have hitherto been widely used.

Japanese Patent No. 5300471 discloses an electronic component including a first functional element portion and a second functional element portion arranged on the first functional element portion. In Japanese Patent No. 5300471, a hollow space is provided between a first substrate on which the first functional element portion is arranged and a second substrate on which the second functional element portion is arranged, and the first and second functional element portions are sealed in the hollow space. In addition, in Japanese Patent No. 5300471, the first and second functional element portions are provided in the hollow space so as to be opposed to each other. The first and second functional element portions are each composed of, for example, a surface acoustic wave (SAW) resonator or a film bulk acoustic resonator (FBAR).

In such an electronic component including multiple functional element portions disclosed in Japanese Patent No. 5300471, large stray capacitance may occur between the functional element portions to degrade characteristics, such as a filter characteristic.

SUMMARY OF THE INVENTION

Accordingly, preferred embodiments of the present invention provide an electronic component that is capable of significantly reducing or preventing stray capacitance and that is less likely to be subjected to degradation of characteristics.

According to a preferred embodiment of the present invention, an electronic component includes first and second element substrates, a first functional element portion that is located on the first element substrate and that includes at least one first functional electrode, a second functional element portion that is located on the second element substrate and that includes at least one second functional electrode, and a support layer that defines a first hollow space over the first functional electrode with the first and second element substrates. The second element substrate includes a first main surface provided at a side opposite to the side of the first hollow space and a second main surface provided at the first hollow space side. The second functional electrode is located on the first main surface. The electronic component further includes a first conductive layer that is provided on the second main surface and that is connected to ground potential. The first conductive layer opposes the first functional electrode in the first hollow space. The first conductive layer is overlapped with at least a portion of the first and second functional electrodes in a plan view.

According to another preferred embodiment of the present invention, an electronic component includes first and second element substrates, a third element substrate provided between the first and second element substrates, a first functional element that is located on the first element substrate and that includes at least one first functional electrode, a second functional element that is located on the second element substrate and that includes at least one second functional electrode, a support layer that defines a first hollow space over the first functional electrode with the first and third element substrates, and a first conductive layer that is provided on the third element substrate and that is connected to ground potential. The first conductive layer opposes the first functional electrode in the first hollow space. The first conductive layer is overlapped with at least a portion of the first and second functional electrodes in a plan view.

The electronic component may further include a second conductive layer that is provided on a main surface of the first element substrate, which is opposite to the first functional electrode. In this case, heat dissipation of the electronic component is further improved.

A second hollow space over the second functional electrode may be provided on the second element substrate.

The electronic component may further include a third conductive layer that is provided on a main surface of the second element substrate, which is opposite to the second functional electrode. In this case, the heat dissipation of the electronic component is further improved.

Each of the first and second functional element portions may define an elastic wave apparatus.

The first element substrate may be a first piezoelectric substrate and the second element substrate may be a second piezoelectric substrate. The first functional electrode may be a first IDT electrode and the second functional electrode may be a second IDT electrode. Each of the first and second functional element portions may define a surface acoustic wave apparatus.

The first conductive layer may be at least overlapped with overlapping areas of the first and second IDT electrodes in a plan view.

The first functional element portion may define a reception filter, the second functional element portion may define a transmission filter, and the electronic component may include a duplexer including the transmission filter and the reception filter.

According to various preferred embodiments of the present invention, it is possible to provide an electronic component that is capable of significantly reducing or preventing stray capacitance and that is less likely to be subjected to degradation of characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will herein be demonstrated by describing specific preferred embodiments of the present invention with reference to the attached drawings.

The preferred embodiments described in the specification are only examples and partial replacement or combination of components may be available between different preferred embodiments.

First Preferred Embodiment

Figure 1A:
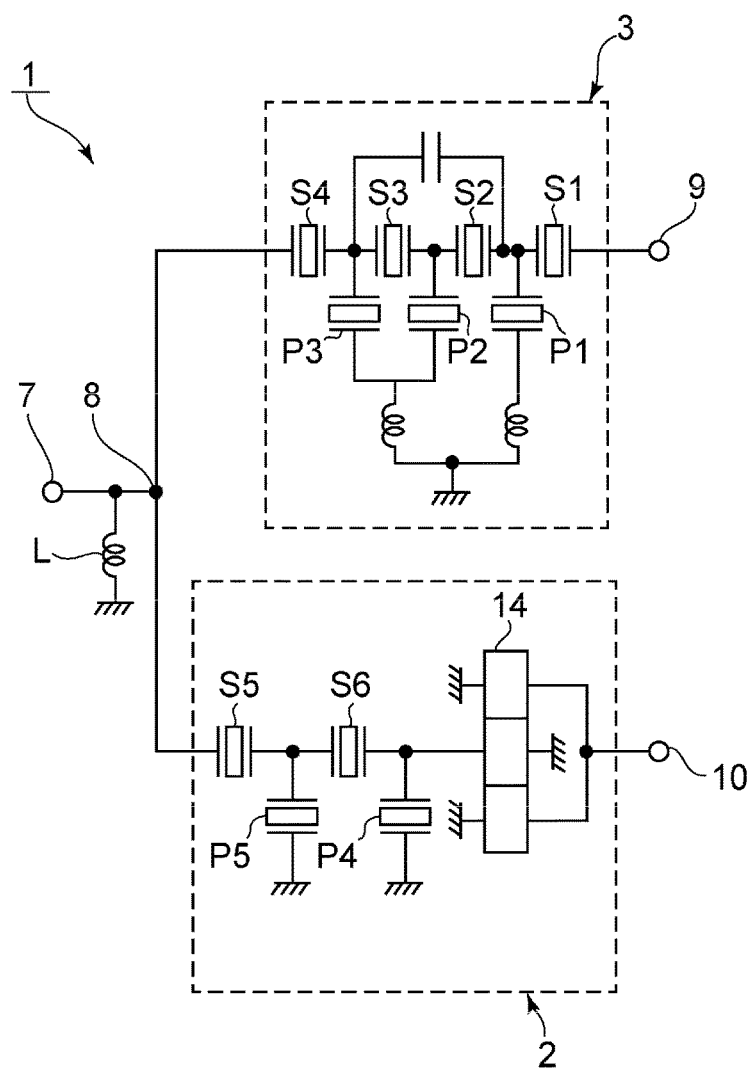
FIG. 1A is a circuit diagram of an electronic component according to a first preferred embodiment of the present invention and FIG. 1B is a schematic plan view illustrating an electrode structure of a one-port elastic wave resonator.
Figure 1B:
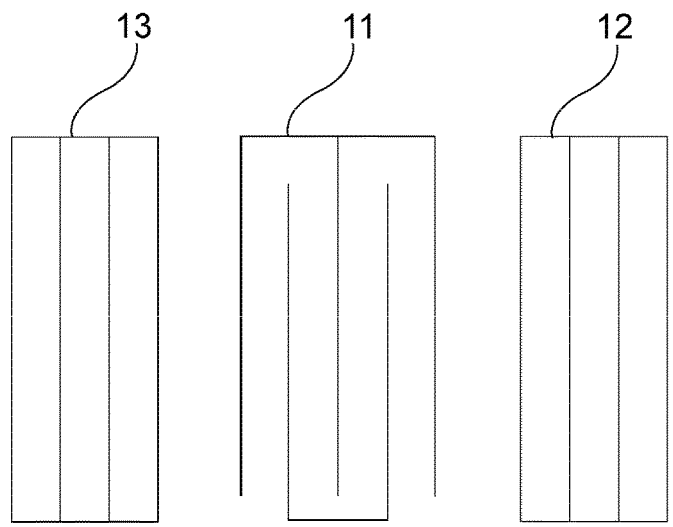
Figure 2A:
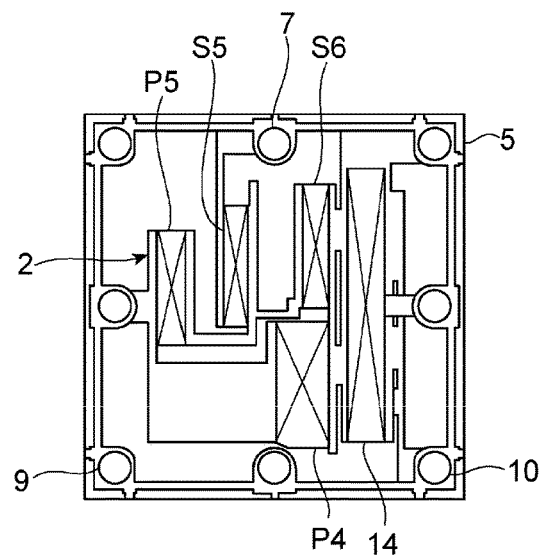
FIGS. 2A to 2C are schematic plan views illustrating a first functional element portion, a first conductive layer, and a second functional element portion, respectively.
Figure 2B:
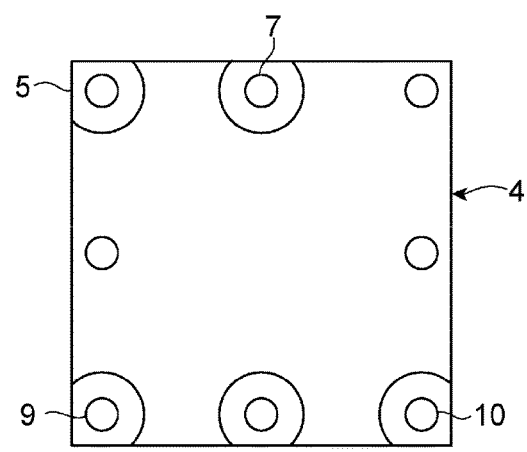
Figure 2C:
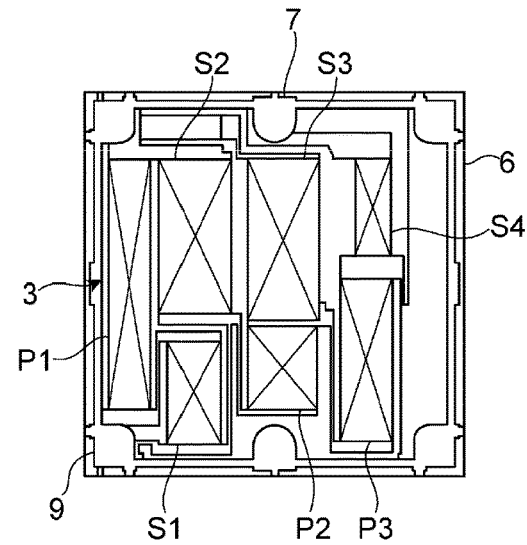

FIG. 1A is a circuit diagram of an electronic component according to a first preferred embodiment of the present invention. FIG. 1B is a schematic plan view illustrating an electrode structure of a one-port elastic wave resonator. FIGS. 2A to 2C are schematic plan views illustrating a first functional element portion, a first conductive layer, and a second functional element portion, respectively.

An electronic component 1 preferably is a duplexer, for example. The electronic component 1 includes a first functional element portion 2 defining and functioning as a reception filter and a second functional element portion 3 defining and functioning as a transmission filter. As illustrated in FIG. 2A, the first functional element portion 2 is located on a first element substrate 5. As illustrated in FIG. 2C, the second functional element portion 3 is located on a second element substrate 6. The second functional element portion 3 is located on the first functional element portion 2. A first conductive layer 4 is located between the first and second functional element portions 2 and 3. The positional relationship between the above components will be described in detail below.

As illustrated in FIG. 1A, the electronic component 1 includes an antenna terminal 7. An impedance matching inductance L is connected between the antenna terminal 7 and ground potential. A common terminal 8 is connected to the antenna terminal 7. The first functional element portion 2 defining and functioning as the reception filter is located between the common terminal 8 and a reception terminal 10. The second functional element portion 3 defining and functioning as the transmission filter is located between the common terminal 8 and a transmission terminal 9.

In the first functional element portion 2 defining and functioning as the reception filter, series arm resonators S5 and S6 and parallel arm resonators P4 and P5 are connected to the common terminal 8. Each of the series arm resonators S5 and S6 and the parallel arm resonators P4 and P5 includes an elastic wave resonator. A three-interdigital-transducer (3IDT) longitudinally coupled resonator type elastic wave filter portion 14 is provided between the series arm resonator S6 and the reception terminal 10. In the longitudinally coupled resonator type elastic wave filter portion 14, three or more odd-number of IDT electrodes are provided in proximity in a row arrangement in a propagation direction of surface acoustic waves propagating on the surface of the first element substrate 5, which is a piezoelectric substrate. Reflectors are provided on both sides of the three or more odd-number of IDT electrodes. In the first functional element portion 2, each of the IDT electrodes of the longitudinally coupled resonator type elastic wave filter portion 14 and the respective resonators is a first functional electrode.

In FIG. 2A, portions in which the series arm resonators S5 and S6, the parallel arm resonators P4 and P5, and the longitudinally coupled resonator type elastic wave filter portion 14 are provided are schematically illustrated by symbols in which Xs are surrounded by substantially rectangular frames. The series arm resonators S5 and S6, the parallel arm resonators P4 and P5, and the longitudinally coupled resonator type elastic wave filter portion 14 are provided on the first element substrate 5.

Referring back to FIG. 1A, the second functional element portion 3 defining and functioning as the transmission filter preferably has a ladder circuit configuration. Specifically, the second functional element portion 3 includes series arm resonators S1 to S4 and parallel arm resonators P1 to P3, each of which is an elastic wave resonator. The series arm resonators S1 to S4 and the parallel arm resonators P1 to P3 each include a one-port elastic wave resonator.

The one-port elastic wave resonator has an electrode structure illustrated in FIG. 1B. An IDT electrode 11 and reflectors 12 and 13 located on both sides of the IDT electrode 11 in the elastic wave propagation direction are located on the second element substrate, which is a piezoelectric substrate. This defines the one-port elastic wave resonator. In the first preferred embodiment, the IDT electrode 11 is a functional electrode. In the first preferred embodiment, in the second functional element portion 3, each of the IDT electrodes 11 of the respective resonators is a second functional electrode.

In FIG. 2C, portions in which the series arm resonators S1 to S4 and the parallel arm resonators P1 to P3 are provided are schematically illustrated by symbols in which Xs are surrounded by substantially rectangular frames. The series arm resonators S1 to S4 and the parallel arm resonators P1 to P3 are provided on the second element substrate 6. The IDT electrode, the reflectors, and connection lines in each elastic wave resonator may be made of appropriate metal, such as Ag, Cu, Pt, or W, or alloy.

Figure 3:
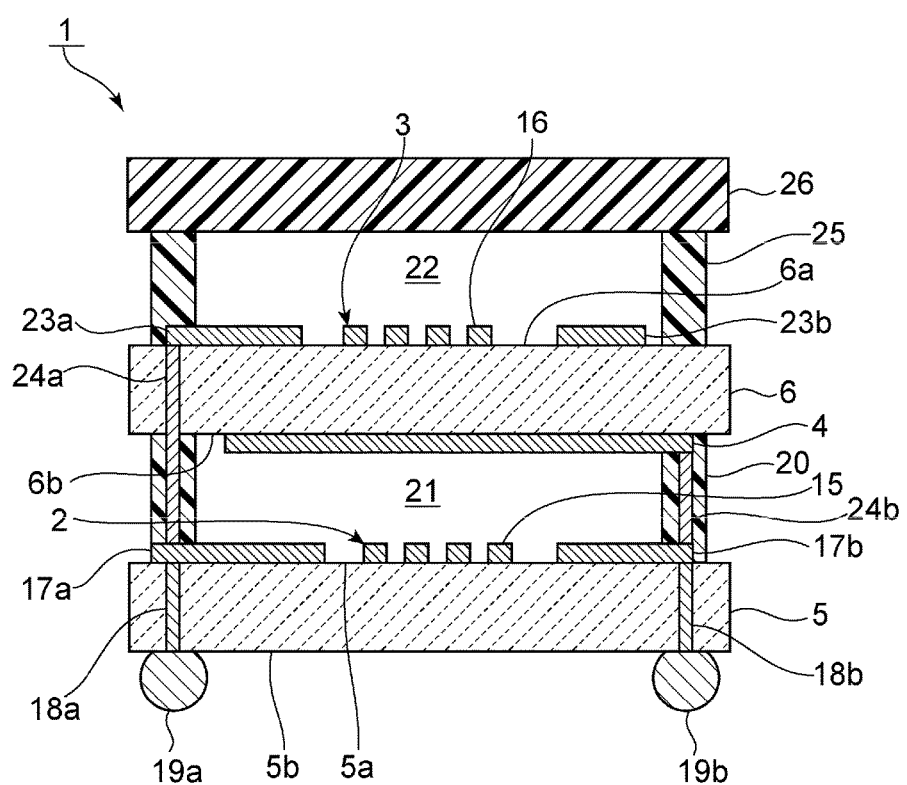
FIG. 3 is a schematic elevational cross-sectional view illustrating a portion where first and second functional electrodes are provided in the electronic component according to the first preferred embodiment of the present invention.

FIG. 3 is a schematic elevational cross-sectional view illustrating a portion where the first and second functional electrodes are provided in the electronic component according to the first preferred embodiment of the present invention. As illustrated in FIG. 3, the first functional element portion 2 is provided on the first element substrate 5. The second functional element portion 3 is provided on the second element substrate 6. The second functional element portion 3 is located on the first functional element portion 2. The first conductive layer 4 is located between the first and second functional element portions 2 and 3.

The first element substrate 5 preferably has a substantially rectangular plate shape. The first element substrate 5 includes a main surface 5a. The first element substrate 5 is a piezoelectric substrate made of $LiTaO_3$. A substrate made of another piezoelectric single crystal, such as $LiNbO_3$, or a piezoelectric ceramic substrate may be used as the first element substrate 5. The first element substrate 5 is not limited to the above piezoelectric substrates. The first element substrate 5 may be a semiconductor substrate made of Si or the like.

First functional electrodes 15 are provided on the main surface 5a of the first element substrate 5. In the first preferred embodiment, each of the first functional electrodes 15 is a first IDT electrode. The first IDT electrode may be made of appropriate metal or alloy, such as Al, Cu, Ni, Ti, Pt, NiCr, or AlCu. The first IDT electrode may be a single-layer metal film or a multilayer metal film in which metal or alloy layers of two or more kinds are laminated. In the first preferred embodiment, the first functional electrodes 15 and the first element substrate 5 define the first functional element portion 2.

Electrode lands 17a and 17b are provided on the main surface 5a of the first element substrate 5. The electrode lands 17a and 17b are electrically connected to the first functional electrodes 15 using wiring electrodes (not illustrated).

Via hole electrodes 18a and 18b are provided in the first element substrate 5. One end of the via hole electrode 18a is connected to the electrode land 17a and one end of the via hole electrode 18b is connected to the electrode land 17b. The other end of the via hole electrode 18a is connected to a bump electrode 19a and the other end of the via hole electrode 18b is connected to a bump electrode 19b. The bump electrodes 19a and 19b are provided on a main surface 5b of the first element substrate 5, which is opposite to the main surface 5a.

A frame shaped first support layer 20 is provided on the main surface 5a of the first element substrate 5. The first support layer 20 covers a portion of the electrode lands 17a and 17b. The first support layer 20 surrounds the first functional electrodes 15. The first support layer 20 is made of resin. The thickness of the first support layer 20 is greater than the thickness of the first functional electrodes 15.

The second element substrate 6 is provided on the first support layer 20. In the electronic component 1, the first element substrate 5, the first support layer 20, and the second element substrate 6 define a first hollow space 21 over the first functional electrodes 15. The first functional electrodes 15 are sealed in the first hollow space 21.

The second element substrate 6 preferably has a substantially rectangular plate shape. The second element substrate 6 includes a first main surface 6a and a second main surface 6b that are opposed to each other. The second element substrate 6 is a piezoelectric substrate made of $LiTaO_3$. A substrate made of another piezoelectric single crystal, such as $LiNbO_3$, or a piezoelectric ceramic substrate may be used as the second element substrate 6. The second element substrate 6 is not limited to the above piezoelectric substrates. The second element substrate 6 may be a semiconductor substrate made of Si or the like.

Second functional electrodes 16 are provided on the first main surface 6a of the second element substrate 6. In the first preferred embodiment, each of the second functional electrodes 16 is a second IDT electrode. The second IDT electrode may be made of appropriate metal or alloy, such as Al, Cu, Ni, Ti, Pt, NiCr, or AlCu. The second IDT electrode may be a single-layer metal film or a multilayer metal film in which metal or alloy layers of two or more kinds are laminated. In the first preferred embodiment, the second functional electrodes and the second element substrate 6 define the second functional element portion 3.

The first conductive layer 4 is provided on the second main surface 6b of the second element substrate 6. The first conductive layer 4 is located over the first hollow space 21. Accordingly, the second main surface 6b is the main surface of the second element substrate 6 at the first hollow space 21 side.

The first conductive layer 4 opposes the first functional electrodes 15. The first conductive layer 4 is connected to the ground potential (not illustrated). The first conductive layer 4 is made of Cu. The first conductive layer 4 may be made of appropriate metal, such as Ni, Cr, Sn, Zn, or Au, or alloy. The thickness of the first conductive layer 4 is preferably about 0.1 μm or more and is more preferably about 3 μm or more, for example. The thickness of the first conductive layer 4 is preferably about 50 μm or less and is more preferably about 20 μm or less, for example. When the thickness of the first conductive layer 4 is greater than or equal to the above lower limit, stray capacitance described below is further reduced or prevented. When the thickness of the first conductive layer 4 is smaller than or equal to the above upper limit, the profile of the electronic component 1 is further lowered.

As illustrated in FIGS. 2A to 2C, in the first preferred embodiment, the first conductive layer 4 includes portions overlapped with the first and second functional electrodes 15 and 16 in a plan view. It is sufficient for the first conductive layer 4 to be provided so that at least a portion of the first conductive layer 4 is overlapped with the first and second functional electrodes 15 and 16 in a plan view. When the first and second functional electrodes 15 and 16 are the IDT electrodes, the first conductive layer 4 is preferably overlapped with overlapping areas of the IDT electrodes in a plan view.

Referring back to FIG. 3, electrode lands 23a and 23b are provided on the first main surface 6a of the second element substrate 6. The electrode land 23a is electrically connected to the second functional electrodes 16 using wiring electrodes (not illustrated). A via hole electrode 24a is provided in the first support layer 20 and the second element substrate 6. One end of the via hole electrode 24a is connected to the electrode land 23a. The other end of the via hole electrode 24a is connected to the electrode land 17a. A via hole electrode 24b one end of which is connected to the electrode land 17b is provided in the first support layer 20. The other end of the via hole electrode 24b is connected to the first conductive layer 4. The electrode lands 17a and 17b and the electrode lands 23a and 23b, the via hole electrodes 18a and 18b and the via hole electrodes 24a and 24b, and the bump electrodes 19a and 19b are each made of appropriate metal or alloy.

A frame shaped second support layer 25 is provided on the first main surface 6a of the second element substrate 6. The second support layer 25 covers a portion of the electrode land 23a. The second support layer 25 surrounds the second functional electrodes 16. The second support layer 25 is made of resin. The thickness of the second support layer 25 is greater than the thickness of the second functional electrodes 16.

A cover layer 26 is provided on the second support layer 25. The cover layer 26 is made of resin. In the electronic component 1, the second element substrate 6, the second support layer 25, and the cover layer 26 form a second hollow space 22 over the second functional electrodes 16. The second functional electrodes 16 are sealed in the second hollow space 22.

In the electronic component 1, the first conductive layer 4 is located between the first and second functional electrodes 15 and 16 in a laminating direction. The first conductive layer 4 is overlapped with at least a portion of the first and second functional electrodes 15 and 16 in a plan view. The first conductive layer 4 is connected to the ground potential. Since the first conductive layer 4 described above is provided to function as an electromagnetic shield in the electronic component 1, the stray capacitance between the first and second functional electrodes 15 and 16 is significantly reduced or prevented. Accordingly, degradation of characteristics is less likely to occur in the electronic component 1.

In addition, in the first preferred embodiment, the first and second functional electrodes 15 and 16 are not opposed to each other and are not sealed in the same space. Accordingly, an issue caused by heat generation in the first and second functional electrodes 15 and 16 is less likely to occur and the degradation of characteristics is less likely to occur. Furthermore, the first conductive layer 4 is provided on the second main surface 6b of the second element substrate 6, which is the main surface opposite to the second functional electrodes 16, the heat generated in the second functional electrodes 16 is more effectively dissipated. Accordingly, the degradation of characteristics is further less likely to occur in the electronic component 1.

The first and second functional element portions 2 and are the reception filter and the transmission filter, respectively, and are elastic wave apparatuses. More specifically, each of the first and second functional element portions 2 and 3 is a surface acoustic wave apparatus. The first and second functional element portions 2 and 3 may be the same functional element or may be different functional elements. The functional element may be a plate wave resonator (bulk acoustic wave (BAW) resonator) using bulk waves.

In the first preferred embodiment, the reception filter is provided on the first element substrate 5 and the transmission filter is provided on the second element substrate 6. In other words, the transmission filter is located on the reception filter. The transmission filter may be provided on the first element substrate 5 and the reception filter may be provided on the second element substrate 6. In other words, the reception filter may be located on the transmission filter.

In addition, the reception filter and the series arm resonators S1 to S4, which are a portion of the transmission filter, may be provided on the first element substrate 5 and the parallel arm resonators P1 to P3 may be provided on the second element substrate 6. Duplexers of different bands may be provided on the first and second element substrates 5 and 6. For example, a duplexer of BAND1 may be provided on the first element substrate 5 and a duplexer of BAND3 may be provided on the second element substrate 6.

Specific examples will now be described.

Examples

In an example, a Cu film of a thickness of about 10 μm was used as the first conductive layer 4 to manufacture the electronic component 1, which is a duplexer of BAND8. In a comparative example, a duplexer that is the same as the duplexer in the example except that the first conductive layer 4 is not provided was manufactured.

Figure 8:
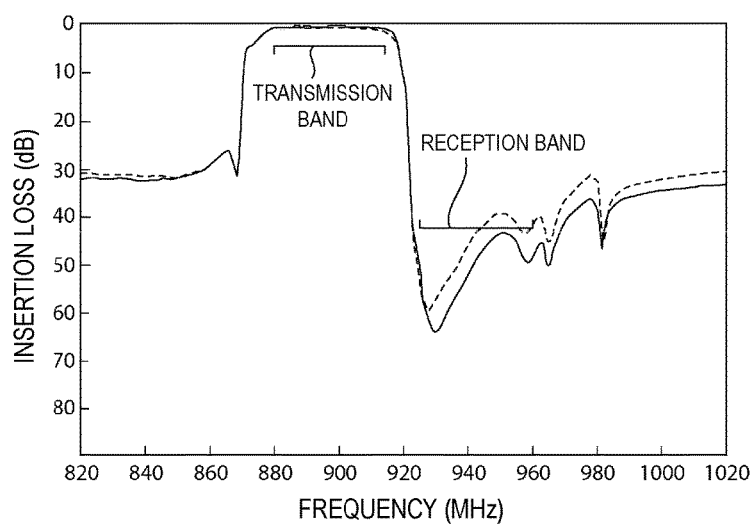
FIG. 8 is a graph indicating transmission characteristics of duplexers of an example and a comparative example.
Figure 9:
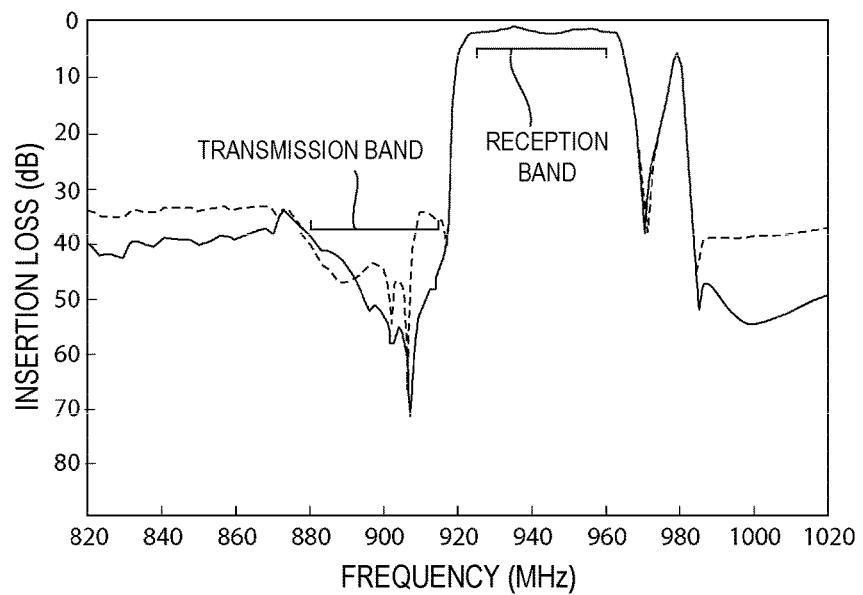
FIG. 9 is a graph indicating reception characteristics of the duplexers of the example and the comparative example.
Figure 10:
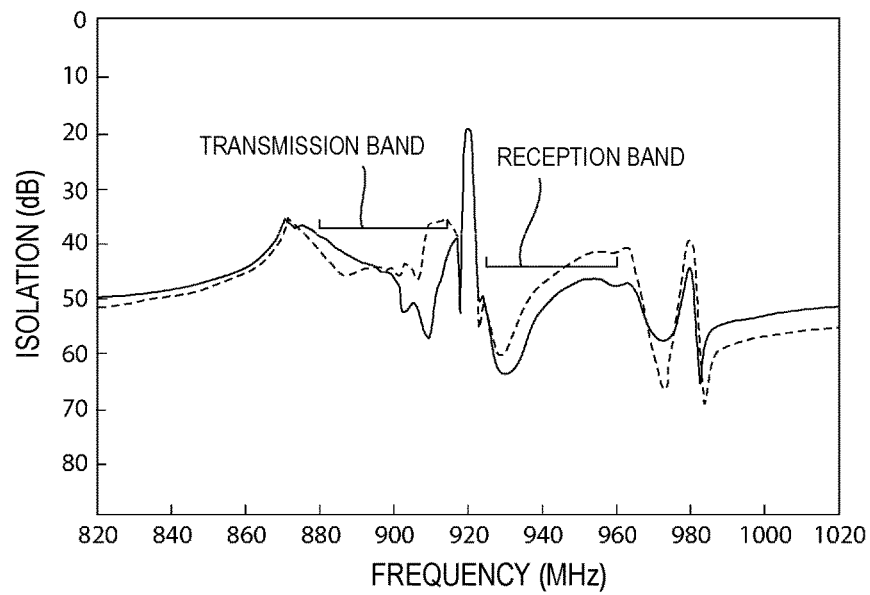
FIG. 10 is a graph indicating isolation characteristics of the duplexers of the example and the comparative example.

FIG. 8 is a graph indicating transmission characteristics of the duplexers of the example and the comparative example. FIG. 9 is a graph indicating reception characteristics of the duplexers of the example and the comparative example. FIG. 10 is a graph indicating isolation characteristics of the duplexers of the example and the comparative example. Referring to FIG. 8 to FIG. 10, each solid line indicates a result of the example and each broken line indicates a result of the comparative example. In FIG. 8 to FIG. 10, a transmission band indicating a transmission frequency band is from about 880 MHz to about 915 MHz and a reception band indicating a reception frequency band is from about 925 MHz to about 960 MHz, for example. FIG. 8 to FIG. 10 indicate that attenuation characteristics are improved in the duplexer of the example in which the first conductive layer 4 is provided, compared with the duplexer of the comparative example.

Figure 11:
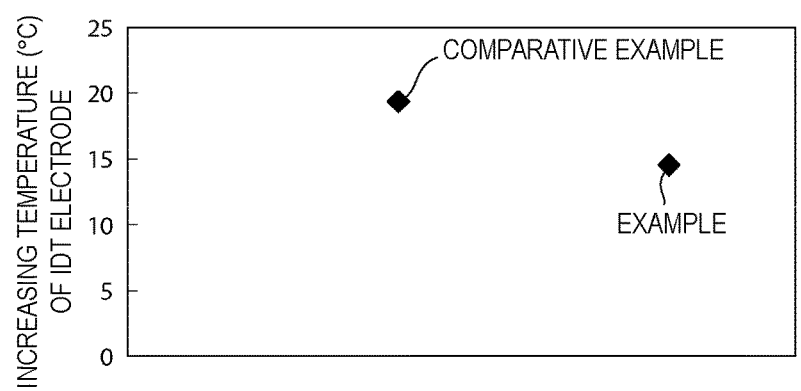
FIG. 11 is a diagram indicating a result of measurement of the increasing temperature of IDT electrodes, which achieves the highest temperature, in the duplexers of the example and the comparative example.

In addition, in the duplexers of the example and the comparative example, power was applied from the transmission terminal 9 at a frequency of about 915 MHz, for example. Power consumption of each resonator was calculated and the increasing temperature of the IDT electrodes, which achieves the highest temperature, was measured. A result was indicated in FIG. 11. As apparent from FIG. 11, heat dissipation characteristics were improved in the duplexer of the example in which the first conductive layer 4 is provided, compared with the comparative example.

Second Preferred Embodiment

Figure 4:
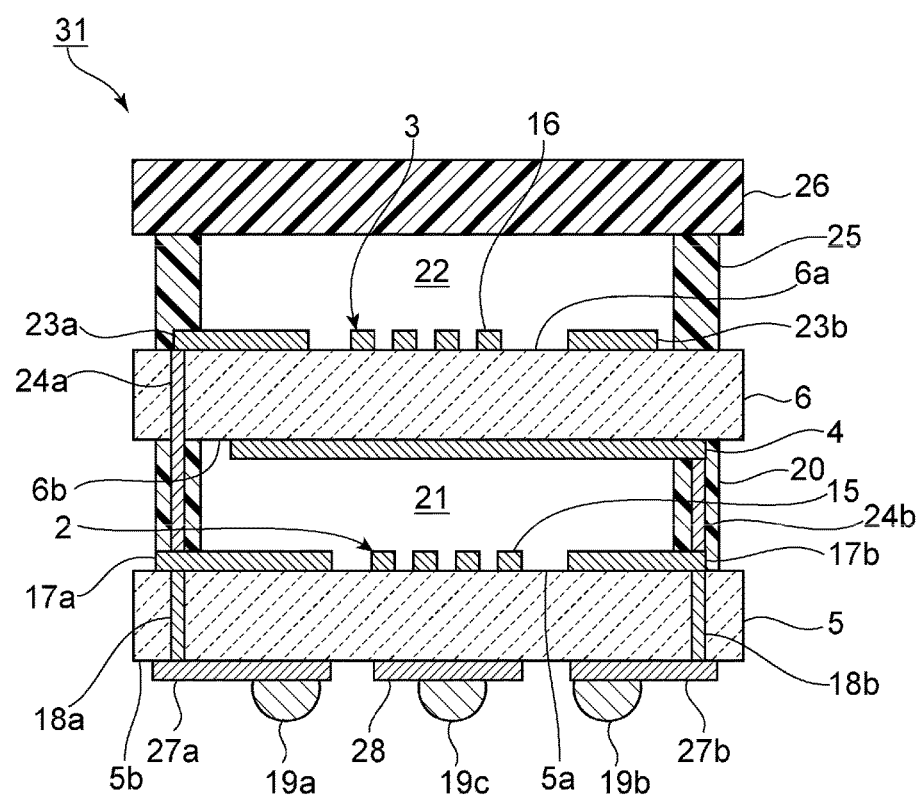
FIG. 4 is a schematic elevational cross-sectional view illustrating a portion where the first and second functional electrodes are provided in an electronic component according to a second preferred embodiment of the present invention.

FIG. 4 is a schematic elevational cross-sectional view illustrating a portion where the first and second functional electrodes are provided in an electronic component according to a second preferred embodiment of the present invention.

In an electronic component 31, a second conductive layer 28 is provided on the main surface 5b of the first element substrate 5, which is opposite to the first functional electrodes 15. The second conductive layer 28 is connected to a bump electrode 19c. The second conductive layer 28 is connected to the ground potential (not illustrated). In addition, in the electronic component 31, the via hole electrodes 18a and 18b are connected to the bump electrodes 19a and 19b with electrode lands 27a and 27b interposed therebetween, respectively. The remaining points are the same as in the first preferred embodiment.

Also in the electronic component 31, the first conductive layer 4 is located between the first and second functional electrodes 15 and 16 in the laminating direction. The first conductive layer 4 is overlapped with at least a portion of the first and second functional electrodes 15 and 16 in a plan view. The first conductive layer 4 is connected to the ground potential. Since the first conductive layer 4 described above is provided, the stray capacitance between the first and second functional electrodes 15 and 16 is significantly reduced or prevented. Accordingly, degradation of characteristics is less likely to occur in the electronic component 31.

In addition, since the first conductive layer 4 is provided on the second main surface 6b of the second element substrate 6, which is the main surface opposite to the second functional electrodes 16, the heat generated in the second functional electrodes 16 is more effectively dissipated. Furthermore, since the second conductive layer 28 is provided on the main surface 5b of the first element substrate 5 in the electronic component 31, the heat generated in the first functional electrodes 15 is more effectively dissipated. Accordingly, the degradation of characteristics is further less likely to occur in the electronic component 31.

Third Preferred Embodiment

Figure 5:
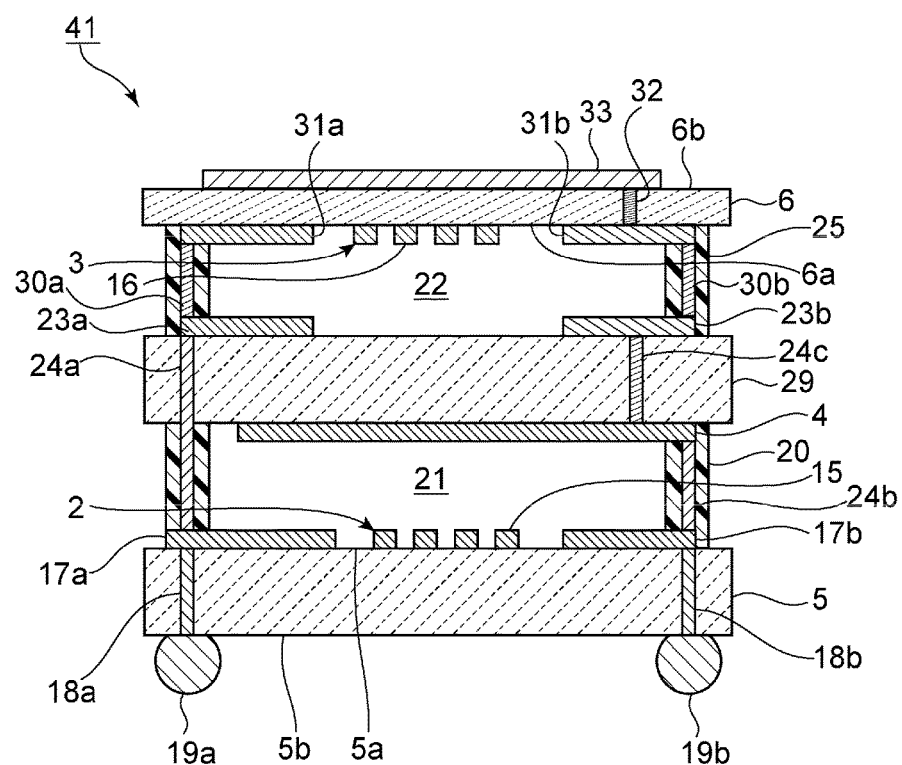
FIG. 5 is a schematic elevational cross-sectional view illustrating a portion where the first and second functional electrodes are provided in an electronic component according to a third preferred embodiment of the present invention.

FIG. 5 is a schematic elevational cross-sectional view illustrating a portion where the first and second functional electrodes are provided in an electronic component according to a third preferred embodiment of the present invention.

In an electronic component 41, a third element substrate 29 is provided at the position where the second element substrate 6 is provided in FIG. 3. The first conductive layer 4 is provided on a main surface of the third element substrate 29 at the first hollow space 21 side. In contrast, the electrode lands 23a and 23b and the second support layer 25 are provided on a main surface of the third element substrate 29 at the second hollow space 22 side. The via hole electrodes 24a and a via hole electrode 24c are provided in the third element substrate 29. One end of the via hole electrode 24c is connected to the first conductive layer 4. The other end of the via hole electrode 24c is connected to the electrode land 23b. The second element substrate 6 is provided on the second support layer 25. The second and third element substrates 6 and 29 and the second support layer 25 define the second hollow space 22.

The second functional electrodes 16 and electrode lands 31a and 31b are provided on the first main surface 6a of the second element substrate 6. A third conductive layer 33 is provided on the second main surface 6b of the second element substrate 6. Via hole electrodes 30a and 30b are provided in the second support layer 25. One end of the via hole electrode 30a is connected to the electrode land 23a and one end of the via hole electrode 30b is connected to the electrode land 23b. The electrode land 31a is connected to the other end of the via hole electrode 30a and the electrode land 31b is connected to the other end of the via hole electrode 30b. A via hole electrode 32 is provided in the second element substrate 6. One end of the via hole electrode 32 is connected to the electrode land 31b. The other end of the via hole electrode 32 is connected to the third conductive layer 33. The remaining points are preferably the same as in the first preferred embodiment.

In the electronic component 41, the first conductive layer 4 is located between the first and second functional electrodes 15 and 16 in the laminating direction. The first conductive layer 4 is overlapped with at least a portion of the first and second functional electrodes 15 and 16 in a plan view. The first conductive layer 4 is connected to the ground potential. Since the first conductive layer 4 described above is provided, the stray capacitance between the first and second functional electrodes 15 and 16 is significantly reduced or prevented. Accordingly, degradation of characteristics is less likely to occur in the electronic component 41.

In addition, since the third conductive layer 33 is provided on the second main surface 6b of the second element substrate 6, which is the main surface opposite to the second functional electrodes 16, the heat generated in the second functional electrodes 16 is more effectively dissipated. Accordingly, the degradation of characteristics is further less likely to occur in the electronic component 41.

Fourth and Fifth Preferred Embodiments

Figure 6:
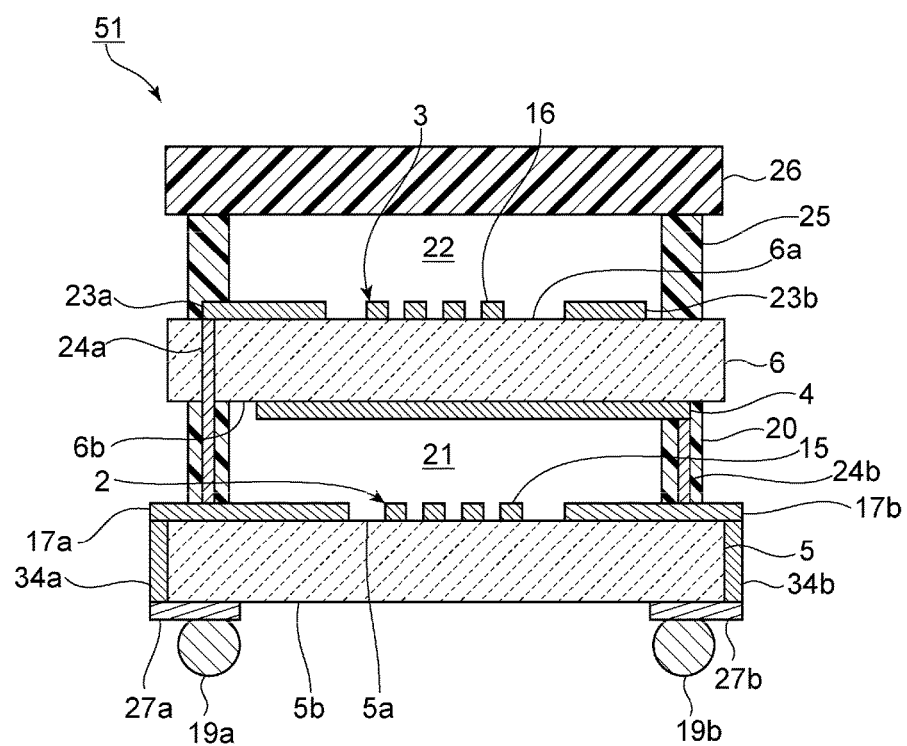
FIG. 6 is a schematic elevational cross-sectional view illustrating a portion where the first and second functional electrodes are provided in an electronic component according to a fourth preferred embodiment of the present invention.
Figure 7:
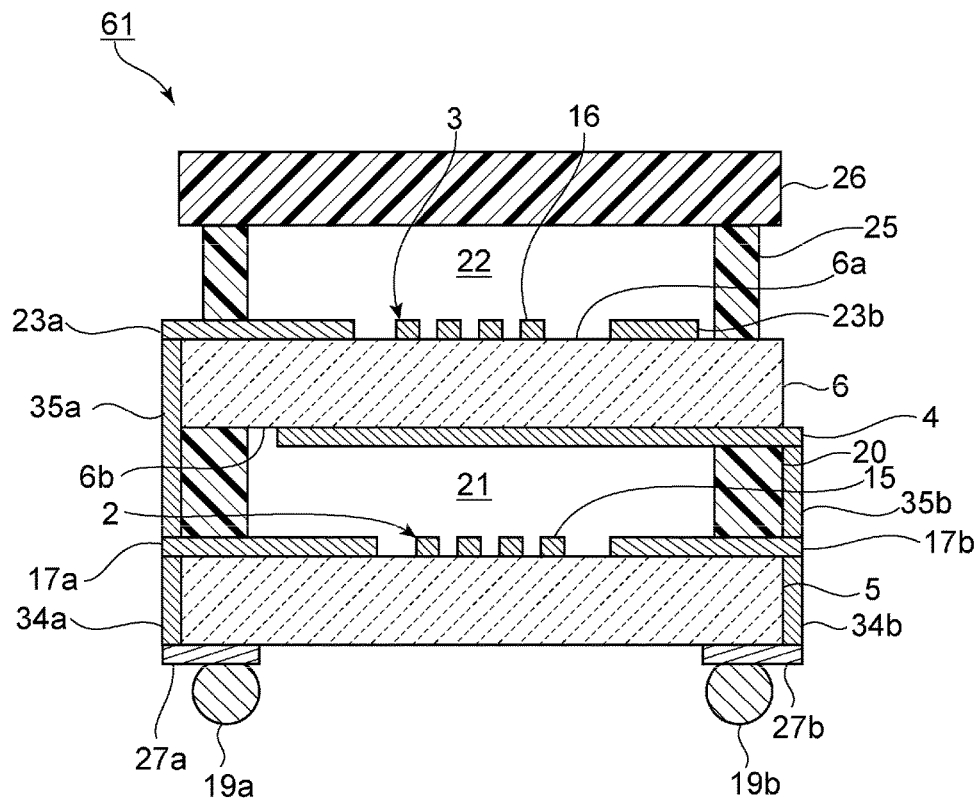
FIG. 7 is a schematic elevational cross-sectional view illustrating a portion where the first and second functional electrodes are provided in an electronic component according to a fifth preferred embodiment of the present invention.

FIG. 6 is a schematic elevational cross-sectional view illustrating a portion where the first and second functional electrodes are provided in an electronic component according to a fourth preferred embodiment of the present invention. FIG. 7 is a schematic elevational cross-sectional view illustrating a portion where the first and second functional electrodes are provided in an electronic component according to a fifth preferred embodiment of the present invention.

Referring to FIG. 6, in an electronic component 51, the electrode land 17a is connected to the electrode land 27a with a side electrode 34a interposed therebetween and the electrode land 17b is connected to the electrode land 27b with a side electrode 34b interposed therebetween. The side electrodes 34a and 34b are provided on side surfaces of the first element substrate 5. The electrode lands 27a and 27b are connected to the bump electrodes 19a and 19b, respectively. Accordingly, no via hole electrode is provided in the first element substrate 5 in the electronic component 51. The remaining points are the same as in the first preferred embodiment.

Referring to FIG. 7, in an electronic component 61, the electrode land 17a is connected to the electrode land 23a with a side electrode 35a interposed therebetween. The side electrode 35a is provided on side surfaces of the first support layer 20 and the second element substrate 6. The electrode land 17b is connected to the first conductive layer 4 with a side electrode 35b interposed therebetween. The side electrode 35b is provided on a side surface of the first support layer 20. Accordingly, no via hole electrode is provided in the first support layer 20 and the second element substrate 6 in the electronic component 61. The remaining points are preferably the same as in the fourth preferred embodiment.

In the electronic components 51 and 61, the first conductive layer 4 is located between the first and second functional electrodes 15 and 16 in the laminating direction. The first conductive layer 4 is overlapped with at least a portion of the first and second functional electrodes 15 and 16 in a plan view. The first conductive layer 4 is connected to the ground potential. Since the first conductive layer 4 described above is provided, the stray capacitance between the first and second functional electrodes 15 and 16 is significantly reduced or prevented. Accordingly, degradation of characteristics is further less likely to occur in the electronic components 51 and 61.

The first and second functional electrodes 15 and 16 are not opposed to each other and are not sealed in the same space in the fourth and fifth preferred embodiments. Accordingly, the degradation of characteristics is also less likely to occur due to heat generation in the first and second functional electrodes 15 and 16. In addition, since the first conductive layer 4 is provided on the second main surface 6b of the second element substrate 6, which is the main surface opposite to the second functional electrodes 16, the heat generated in the second functional electrodes 16 is more effectively dissipated. Accordingly, the degradation of characteristics is further less likely to occur in the electronic components 51 and 61.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   first and second element substrates;
   a first functional element that is located on the first element substrate and that includes at least one first functional electrode;
   a second functional element that is located on the second element substrate and that includes at least one second functional electrode; and
   a support layer that defines a first hollow space over the first functional electrode with the first and second element substrates; wherein
   the second element substrate includes a first main surface provided at a side opposite to the side of the first hollow space and a second main surface provided at the first hollow space side; and
   the second functional electrode is located on the first main surface, the electronic component further comprising:
   a first conductive layer that is provided on the second main surface and that is connected to ground potential; and
   a second conductive layer that is provided on a main surface of the first element substrate, which is opposite to the first functional electrode; wherein
   the first conductive layer opposes the first functional electrode in the first hollow space;
   the first conductive layer is overlapped with at least a portion of the first and second functional electrodes in a plan view; and
   the second conductive layer is overlapped with at least a portion of the first functional electrode in a plan view.

2. The electronic component according to claim 1, wherein a second hollow space over the second functional electrode is provided on the second element substrate.

3. The electronic component according to claim 1, wherein each of the first and second functional element portions defines an elastic wave apparatus.

4. The electronic component according to claim 1, wherein
   the first element substrate is a first piezoelectric substrate and the second element substrate is a second piezoelectric substrate;
   the first functional electrode is a first interdigital transducer electrode and the second functional electrode is a second interdigital transducer electrode; and
   each of the first and second functional element portions defines a surface acoustic wave apparatus.

5. The electronic component according to claim 4, wherein the first conductive layer is at least overlapped with overlapping areas of the first and second interdigital transducer electrodes in a plan view.

6. The electronic component according to claim 1, wherein
   the first functional element portion defines a reception filter;
   the second functional element portion defines a transmission filter; and
   the electronic component defines a duplexer including the transmission filter and the reception filter.

7. The electronic component according to claim 1, further comprising:
   an electrode land that is connected to any one of an antenna terminal, a reception terminal, and a transmission terminal, and that is provided on the main surface of the first element substrate, which is opposite to the first functional electrode; wherein
   the second conductive layer is provided so as to be separated from the electrode land.

8. An electronic component comprising:
   first and second element substrates;
   a third element substrate provided between the first and second element substrates;
   a first functional element that is located on the first element substrate and that includes at least one first functional electrode;
   a second functional element that is located on the second element substrate and that includes at least one second functional electrode; and
   a support layer that defines a first hollow space over the first functional electrode with the first and third element substrates; wherein
   the second element substrate includes a first main surface and a second main surface; and
   the second functional electrode is located on the first main surface of the second element substrate, the electronic component further comprising:
   a first conductive layer that is provided on a main surface of the third element substrate and that is connected to ground potential;
   a second conductive layer that is provided on a main surface of the first element substrate, which is opposite to the first functional electrode; and
   a third conductive layer that is provided on the second main surface of the second element substrate, which is opposite to the second functional electrode; wherein
   the first conductive layer opposes the first functional electrode in the first hollow space;
   the first conductive layer is overlapped with at least a portion of the first and second functional electrodes in a plan view; and
   the second conductive layer is overlapped with at least a portion of the first functional electrode in a plan view.

9. The electronic component according to claim 8, further comprising:
   an electrode land that is connected to any one of an antenna terminal, a reception terminal, and a transmission terminal, and that is provided on the main surface of the first element substrate, which is opposite to the first functional electrode; wherein
   the second conductive layer is provided so as to be separated from the electrode land.

10. An electronic component comprising:
    first and second element substrates;
    a third element substrate provided between the first and second element substrates;
    a first functional element that is located on the first element substrate and that includes at least one first functional electrode;
    a second functional element that is located on the second element substrate and that includes at least one second functional electrode;
    a support layer that defines a first hollow space over the first functional electrode with the first and third element substrates;
    a first conductive layer that is provided on the third element substrate and that is connected to ground potential; and
    a second conductive layer that is provided on a main surface of the first element substrate, which is opposite to the first functional electrode; wherein
    the first conductive layer opposes the first functional electrode in the first hollow space;

the first conductive layer is overlapped with at least a portion of the first and second functional electrodes in a plan view; and the second conductive layer is overlapped with at least a portion of the first functional electrode in a plan view.

11. The electronic component according to claim 10, wherein a second hollow space over the second functional electrode is provided on the second element substrate.

12. The electronic component according to claim 10 further comprising:

a third conductive layer that is provided on the main surface of the second element substrate, which is opposite to the second functional electrode.

13. The electronic component according to claim 10, wherein each of the first and second functional element portions defines an elastic wave apparatus.

14. The electronic component according to claim 10, wherein the first element substrate is a first piezoelectric substrate and the second element substrate is a second piezoelectric substrate;

the first functional electrode is a first interdigital transducer electrode and the second functional electrode is a second interdigital transducer electrode; and each of the first and second functional element portions defines a surface acoustic wave apparatus.

15. The electronic component according to claim 14, wherein the first conductive layer is at least overlapped with overlapping areas of the first and second interdigital transducer electrodes in a plan view.

16. The electronic component according to claim 10, wherein the first functional element portion defines a reception filter;

the second functional element portion defines a transmission filter; and the electronic component defines a duplexer including the transmission filter and the reception filter.

17. The electronic component according to claim 10, further comprising:

an electrode land that is connected to any one of an antenna terminal, a reception terminal, and a transmission terminal, and that is provided on the main surface of the first element substrate, which is opposite to the first functional electrode; wherein the second conductive layer is provided so as to be separated from the electrode land.

* * * * *